United States Patent [19]

Itaya et al.

[11] Patent Number: 4,780,712
[45] Date of Patent: Oct. 25, 1988

[54] POLAR COORDINATE DISPLAY DEVICE EMPLOYING RASTER SCAN SCHEME

[75] Inventors: Hiroshi Itaya, Isehara; Goro Saito, Aikawamachi, both of Japan

[73] Assignee: Anritsu Corporation, Tokyo, Japan

[21] Appl. No.: 946,574

[22] PCT Filed: Apr. 8, 1986

[86] PCT No.: PCT/JP86/00169
§ 371 Date: Dec. 1, 1986
§ 102(e) Date: Dec. 1, 1986

[87] PCT Pub. No.: WO86/06196
PCT Pub. Date: Oct. 23, 1986

[30] Foreign Application Priority Data

Apr. 8, 1985 [JP] Japan .................................. 60-72573

[51] Int. Cl.⁴ ............................................. G09G 1/02
[52] U.S. Cl. ..................................... 340/747; 340/799
[58] Field of Search ................ 340/750, 799, 747, 721, 340/724, 734

[56] References Cited

U.S. PATENT DOCUMENTS 4,200,869  4/1980  Murayama et al. ................... 340/721

FOREIGN PATENT DOCUMENTS 0144289 11/1980 Japan.
0143485 11/1980 Japan.
0036104 11/1981 Japan.

Primary Examiner—John W. Caldwell, Sr.
Assistant Examiner—Alvin Oberley
Attorney, Agent, or Firm—Frishauf, Holtz, Goodman & Woodward

[57] ABSTRACT

A signal analyzer outputs polar coordinate data to be displayed on an image display unit employing a raster scan scheme. First and second image memories having memory formats corresponding to the screen of the image display unit are provided. A memory switching circuit switches the first and second image memories at each measurement scan so that either one of the first and second memories is set at a write side and a remaining one is set at a deletion side. The polar coordinate data is sequentially written in one of the first and second image memories, data of a previous scan written in the other of the memories is sequentially deleted, and data of both memories are read out simultaneously, so that the polar coordinate data is displayed on the image display unit of the raster scan scheme without discontinuity and in a real time manner.

3 Claims, 5 Drawing Sheets

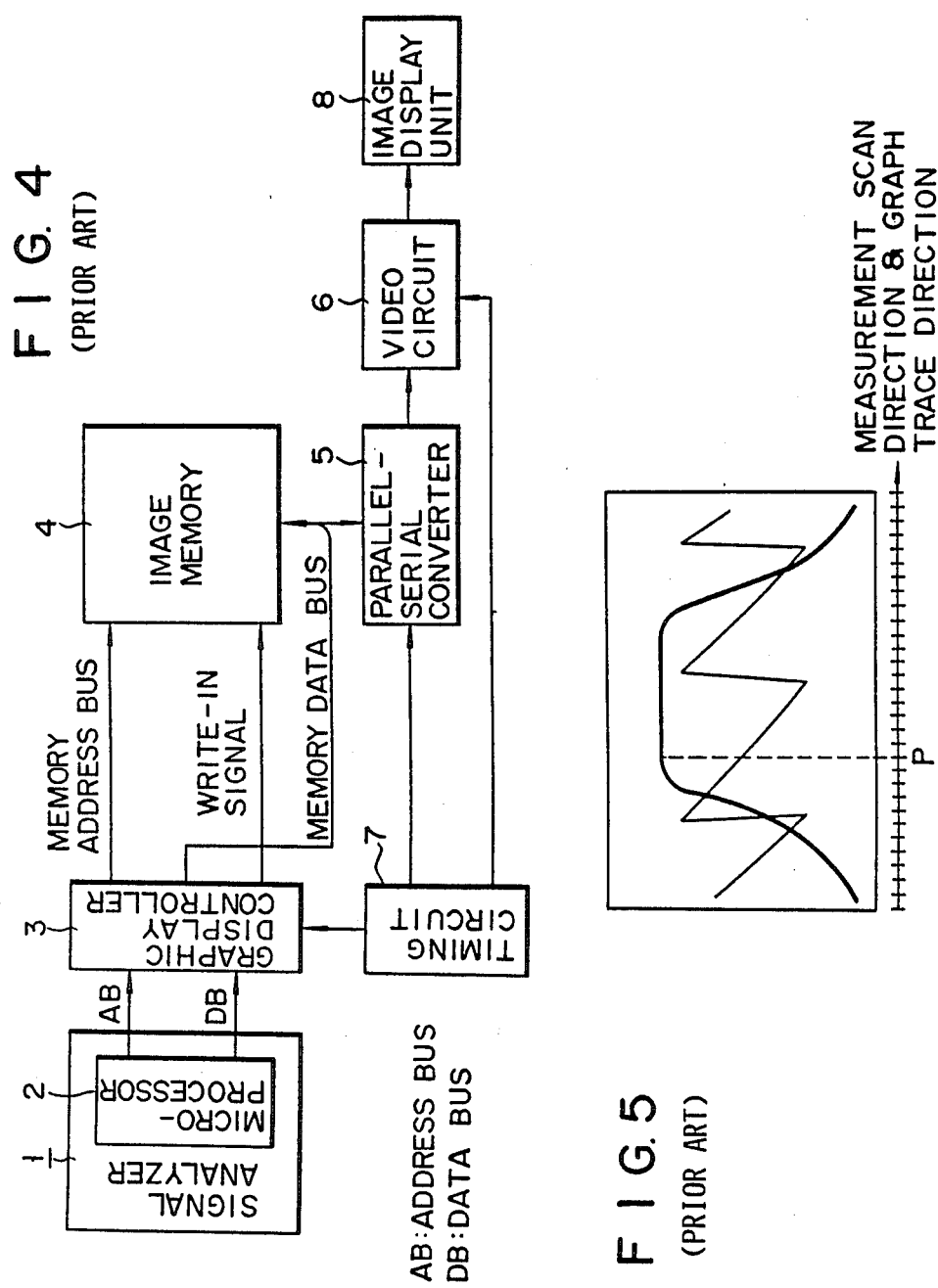

POLAR COORDINATE DISPLAY DEVICE EMPLOYING RASTER SCAN SCHEME

[TECHNICAL FIELD]

The present invention relates to a polar coordinate display device employing a raster scan scheme and, more particularly, to an improved polar coordinate display device which can display, as a vector, measurement data which is supplied from a signal analyzer such as a network analyzer, as a polar coordinate graph without discontinuity, in a real time manner, on an image display unit employing a raster scan scheme.

[BACKGROUND ART]

As is well known, measurement data such as transmission characteristics analyzed or measured by a network analyzer, or an impedance which is analyzed or measured by an impedance analyzer, is given as a vector defined by an amplitude and a phase. When the measurement data expressed by such a vector is converted into polar coordinates and displayed as an image, whose amplitude and phase can be read from a single curve of a graph. In this case, it is convenient to use an image display unit employing a raster scan scheme. This is because a conventional image display unit (CRT display), represented by a television monitor, can be used.

FIG. 4 shows a conventional polar coordinate display device employing the raster scan scheme. For example, microprocessor 2 in signal analyzer 1, such as a network analyzer, converts vector data analyzed by signal analyzer 1 into polar coordinates, and sets the polar coordinate data and address data for image memory 4, which stores the polar coordinate data in graphic display controller 3 via data and address buses DB and AB. Graphic display controller 3 sets, in image memory 4, address data therefor set by microprocessor 2, and writes graph data (to be described later), based on the polar coordinate data converted by microprocessor 2, at a set address of image memory 4. Image memory 4 has a memory format having a one-to-one correspondence to the screen display format of image display unit 8 of a raster scan scheme such as a CRT. Graphic display controller 3 reads out data of image memory 4 by a timing pulse generated by timing circuit 7 in synchronism with raster scan by image display unit 8. In this case, a write-in cycle and a read-out (raster scan) cycle, in accordance with which graphic display controller 3 accesses image memory 4, are executed in a time divisional manner. Parallel-bit data read out from image memory 4 is converted into serial-bit data in parallel-serial converter 5 by a timing pulse generated by timing circuit 7. The serial-bit data is converted into a video signal via video circuit 6 and supplied to image display unit 8, so that the vector data analyzed by signal analyzer 1 is displayed as a graph curve of polar coordinate data.

When the vector data analyzed or measured by signal analyzer 1 is displayed in a real time manner to correspond to measurement scan, the graph of the coordinates which corresponds to the respective measurement point, i.e., previous graph data written in image memory 4, must be deleted, while displaying new data on the same coordinate system.

FIG. 5 shows an orthogonal coordinate system wherein a measurement scan direction and a graph display direction (to be referred to as a trace direction hereinafter) are the same, and the pitch of graph display (to be referred to as a trace hereinafter) is constant. In this case, no inconvenience occurs when the previous data is deleted and the new data is displayed in the case described above. This is because a graph of new point P in the measurement scan direction can be displayed by deleting data of the graph on point P from an image memory and writing new data in the image memory.

In contrast to this, FIG. 6 shows a polar coordinate system wherein a horizontal direction is expressed by $X = A\cos\theta$ and a vertical direction is expressed as $\gamma = A\sin\theta$. In this case, a measurement scan direction and a graph trace direction are generally different. In polar coordinate representation, the pitch of the graph trace is different from that of orthogonal coordinate representation, and is not constant. For this reason, when the vector data analyzed by signal analyzer 1 is displayed in accordance with the raster scan scheme as a polar coordinate on image display unit 8 by the conventional polar coordinate display device, part of the displayed graph becomes discrete, as shown in FIG. 7, so that the displayed graph is discontinuous. When the discontinuity is eliminated, the entire graph cannot be displayed in a real time manner.

This drawback will be described so that it can be understood easily. FIG. 8 is a partially enlarged view of FIG. 6. Assume that the trace of a graph is displayed by plotting points P10, P11, P12, ... at a certain measurement scan. Points P10, P11, P12, ... correspond to data of the respective measurement points analyzed by signal analyzer 1. When data corresponding to point P11 is written in image memory 4, graphic display controller 3 performs interpolation to smoothly connect points P10 and P11. The interpolated data, i.e., the graph data (including data corresponding to points P10 and P11) is also written in image memory 4. The same operation is performed for points P12, P13, .... Therefore, when data stored in image memory 4 is read out in a first measurement scan, a continuous graph is displayed on the screen of display unit 8, as shown in FIG. 6.

In a next measurement scan, assume that the positions of the respective measurement points of data analyzed by signal analyzer 1 are those represented by P20, P21, P22, ... in FIGS. 6 and 8. In this case, when the graph data between points P20 and P21 is written in image memory 4, graphic display controller 3 first deletes the graph data connecting points P10 and P11 of the previous measurement scan, and writes the graph data between points P20 and P21 in image memory 4. Subsequently, when graph data between points P21 and P22 is written in image memory 4, graphic display controller 3 first deletes the graph data between points P11 and P12 of the previous measurement scan, and writes the graph data between points P21 and P22 in image memory 4. As a result, in the measurement scans following the second measurement scan, the graph data between points P11 and P21 is deleted, and the portion between points P11 and P21 is displayed as a discontinuous portion on the CRT screen. The portion between points P12 and P22 becomes discontinuous in the same manner. In this way, with a conventional circuit configuration, a displayed graph based on polar coordinate data is discontinuous, as shown in FIG. 7.

In order to prevent discontinuity in graph with the conventional circuit configuration, after a certain measurement scan is completed, all of the graph data of the measurement scan written in image memory 4 must first be deleted, and then new graph data of a next measurement scan must be written in image memory 4. In this case, however, every time measurement scan is performed, previous graph is deleted from the screen. As a result, such a conventional circuit configuration cannot be used in a measurement device which preferably displays vector data, analyzed by analyzer 1, as a polar coordinate by the raster scan scheme in a real time manner.

[DISCLOSURE OF INVENTION]

It is an object of the present invention to provide a polar coordinate display device employing a raster scan scheme, which can display a vector given in synchronism with a measurement scan as a continuous polar coordinate graph in a real time manner.

The present invention provides a polar coordinate display device employing a raster scan scheme, comprising display data input means, which converts vector data of a plurality of measurement points supplied in synchronism with a measurement scan into polar coordinate data as display data and inputs the converted polar coordinate data, image display means which can display the polar coordinate data input by the display data input means by the raster scan scheme, first and second image memories having memory formats corresponding to a screen of the image display means, write control means which alternately switches the first and second image memories at each measurement scan, so that polar coordinate data of the plurality of measurement points supplied from the display data input means can be sequentially written in either one of the first and second image memories, and data written in the remaining one of the first and second memories, which is a non-write side, is deleted, sequentially, and read control means which sequentially reads out write data from the first and second image memories in synchronism with the raster scan of the image display means, synthesizes the readout data, and supplies the synthesized data to the image display unit as display data.

[BRIEF DESCRIPTION OF DRAWINGS]

FIG. 4 is a block diagram of a conventional polar coordinate display device employing a raster scan scheme;

FIG. 5 is a view of a screen surface for explaining a graph representation of an orthogonal coordinate system;

[BEST MODE OF CARRYING OUT THE EMBODIMENT]

An embodiment of the present invention will be described with reference to the accompanying drawings.

Figure 1:
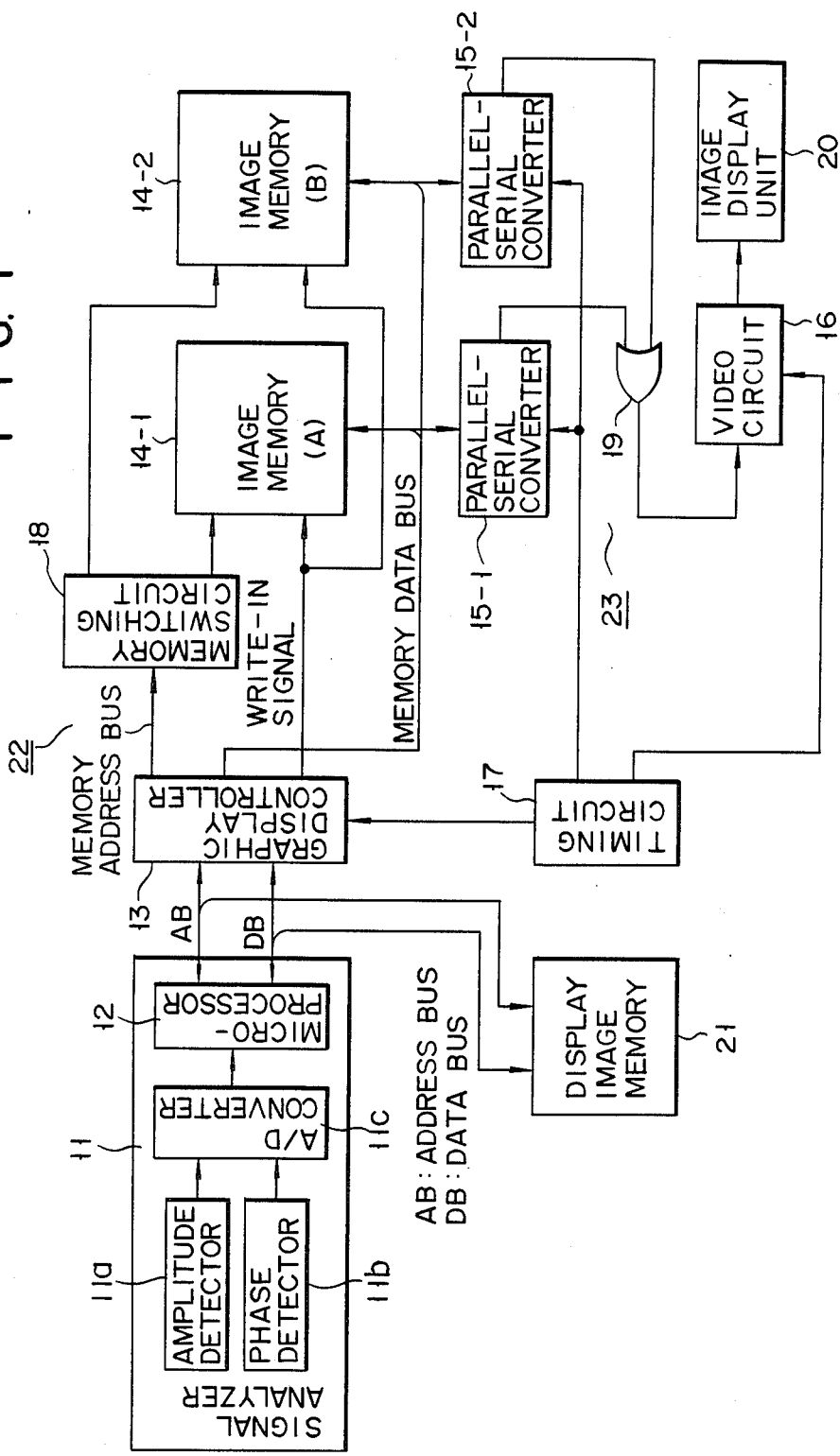
FIG. 1 is a block diagram of a polar coordinate display device employing a raster scan scheme according to an embodiment of the present invention.

Referring to FIG. 1, reference numeral 11 denotes a signal analyzer such as a network analyzer. Signal analyzer 11 has A/D converter 11c and microprocessor 12. A/D converter 11c A/D converts analog amplitude and phase data supplied from amplitude and phase detectors 11a and 11b to obtain vector data for a plurality of measurement points. Microprocessor 12 converts the vector data from converter 11c into polar coordinate data and performs predetermined control required for the entire device. Microprocessor 12 can be a known integrated circuit (e.g., 68,000 MPU).

Microprocessor 12 sets, in graphic display controller 13, polar coordinate data of each of a plurality of measurement points of every measurement scan which is supplied in the above-described manner, and address data for first and second image memories 14-1 and 14-2 for storing the polar coordinate data in the manner to be described later, via data and address buses DB and AB. Graphic display controller 13 can be a known integrated circuit (e.g., 63484 ACRTC).

The polar coordinate data and the address data are also stored in display image memory 21 via data and address buses DB and AB. The memory content of display image memory 21 is updated with a delay for a time corresponding to 1 measurement scan. Namely, display image memory 21 stores data of a previous measurement scan.

Graphic display controller 13 sets, in first and second image memories 14-1 and 14-2 which are switched by memory switching circuit 18 in the manner to be described later, the address data for first and second image memories 14-1 and 14-2 and display image memory 21, which is set by microprocessor 12. Graphic display controller 13 also writes or deletes graph data based on the polar coordinate data set by microprocessor 12 at a corresponding address of first or second image memory 14-1 or 14-2 at each scan.

First and second image memories 14-1 and 14-2 have memory formats with a one-to-one correspondence to the image display format of image display unit 20, such as a CRT, employing the raster scan scheme.

Memory switching circuit 18 is switched in accordance with a designation by microprocessor 12 such that new polar coordinate data is written in first or second image memory 14-1 or 14-2 via graphic display controller 13 at each scan, or polar coordinate data of the previous scan stored at a corresponding address of display image memory 21 is deleted.

Timing circuit 17 supplies a timing pulse which is necessary for executing, in a time division manner, a write-in (including deletion) cycle or a readout cycle (to be described later) for first and second image memories 14-1 and 14-2 via graphic display controller 13.

The readout cycle is executed by reading out, by graphic display controller 13, data from both first and second image memories 14-1 and 14-2 simultaneously in synchronism with the raster scan by image display unit 20 in response to the timing pulse from timing circuit 17. Parallel-bit data read out from first and second image memories 14-1 and 14-2 simultaneously, i.e., new data written for a certain measurement scan, and the immediately preceding data, are converted into serial-bit data by parallel-serial converters 15-1 and 15-2 in accordance with a predetermined timing pulse from timing circuit 17, respectively. Bit data of the serial-bit data are synthesized by OR circuit 19 and converted into a video signal by video circuit 16. The synthesized video signal is supplied to image display unit 20.

Namely, in the above arrangement, display image memory 21, graphic display controller 13, timing circuit 17, and memory switching circuit 18 constitute write-in control means 22 for first and second image memories 14-1 and 14-2. The function of display image memory 21 can be incorporated in microprocessor 12. Switching circuit 18 can be a known integrated circuit (e.g., 74138 decoder).

In the above arrangement, graphic display controller 13, timing circuit 17, parallel-serial converters 15-1 and 15-2, OR circuit 19, and video circuit 16 constitute readout control means 23 for first and second image memories 14-1 and 14-2.

The present invention comprises two image memories having a one-to-one correspondence to the display screen of image display unit 20, as is apparent from FIG. 1. In a certain measurement scan, image memory 14-1 is assigned to write-in, and the other image memory 14-2 is assigned to deletion. In a next measurement scan, image memory 14-1 is assigned to deletion, and image memory 14-2 is assigned to write-in. In other words, image memories 14-1 and 14-2 are switched for write-in and deletion alternately for each measurement scan. Note that access to image memories 14-1 and 14-2 for write-in and readout is performed in a time division manner.

The operation of this embodiment will be described in detail. Data analyzed by signal analyzer 11 is set, together with its address, in graphic display controller 13. Graphic display controller 13 performs interpolation based on the data analyzed by signal analyzer 11 at a certain measurement scan. Obtained graph data is sequentially written in, e.g., image memory 14-1. In a next measurement scan, interpolated graph data based on data analyzed by signal analyzer 11 is sequentially written in image memory 14-2. In response to write-in to image memory 14-2, graphic display controller 13 operates to sequentially delete the graph data written in image memory 14-1 of a preceding measurement scan in accordance with a command from microprocessor 12. At this time, image memories 14-1 and 14-2 are switched by memory switching circuit 18.

Graphic display controller 13 accesses image memories 14-1 and 14-2 simultaneously at a timing corresponding to raster scan of image display unit 20, in order to read out data written in image memories 14-1 and 14-2.

Figure 3:
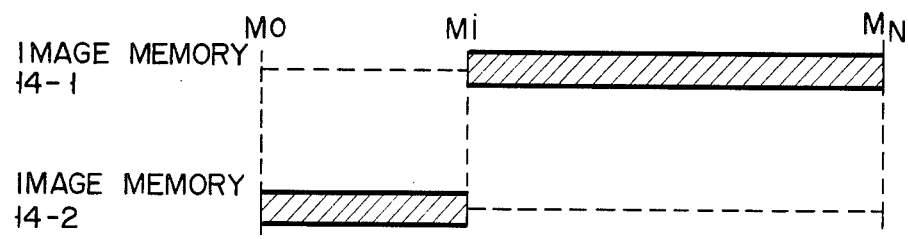
FIG. 3 is a view for explaining new writing and deletion with respect to the first and second image memories used in this embodiment.
Figure 6:
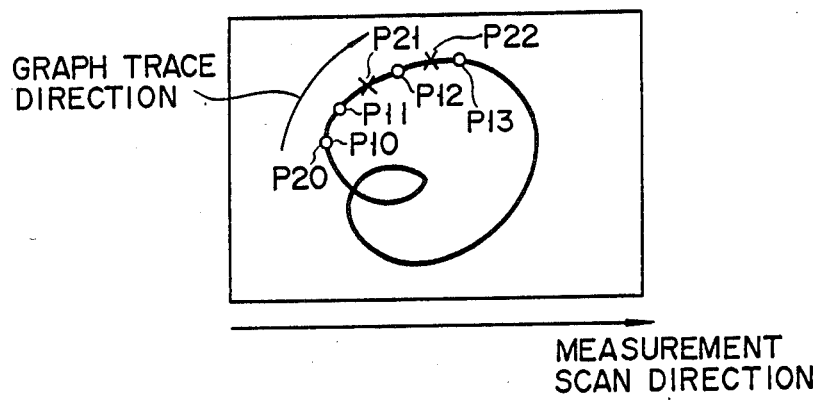
FIG. 6 is a view of a screen surface for explaining a graph representation of a polar coordinate system.
Figure 7:
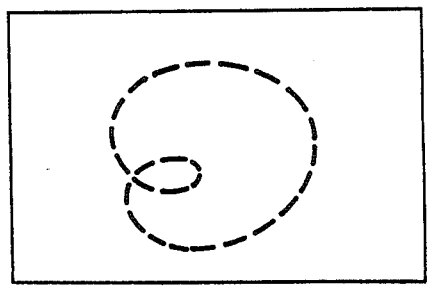
FIG. 7 is a view of a screen surface for explaining a polar coordinate representation with a conventional circuit configuration.
Figure 8:
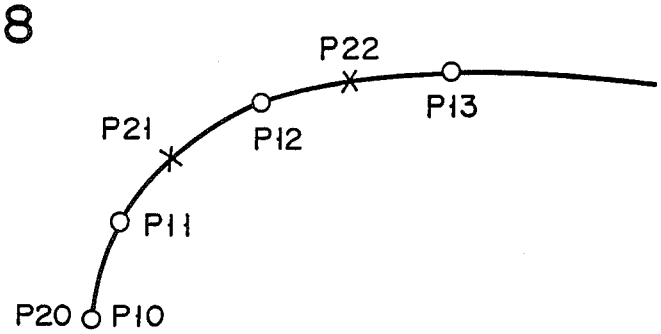
FIG. 8 is a partially enlarged view of FIG. 6.

Assume that data analyzed and output from signal analyzer 11 corresponds to ith measurement point $M_i$ of a certain measurement scan, and graph data between measurement points $M_0$ and $M_i$ is written in image memory 14-2, as shown in FIG. 3. In this case, graph data of 0th to ith measurement points, e.g., measurement points $M_0$ to $M_i$ of a previous measurement scan written in image memory 14-2 are deleted, as seen from the above description, and graph data between measurement points $M_i$ and $M_N$ remains written and is not deleted. Meanwhile, graph data of measurement points $M_i$ to $M_N$ written in image memory 14-2 is deleted in the second previous measurement scan. Therefore, when graphic display controller 13 performs the above-described raster scan at a time point at which the data of measurement point $M_i$ is written in image memory 14-2, new graph data between measurement points $M_0$ and $M_i$ is read out from image memory 14-2, and graph data between measurement points $M_i$ and $M_N$ written in the previous measurement scan is read out from image memory 14-1. In this manner, the respective data read out from image memories 14-1 and 14-2 are converted from parallel-bit data into serial-bit data by parallel-serial converters 15-1 and 15-2, and are synthesized by OR circuit 19 to form graph data for the same frame. The synthesized graph data is converted into a video signal by video circuit 16, and is supplied to image display unit 20.

Figure 2:
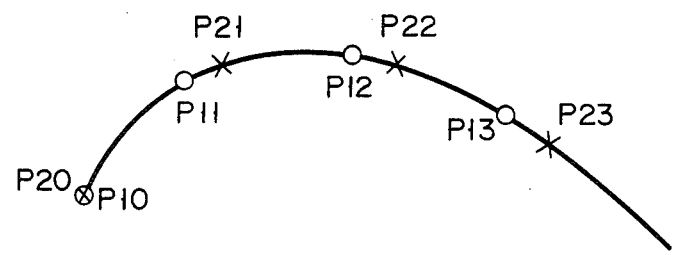
FIG. 2 is an enlarged view of a screen surface for explaining that no discontinuity occurs in a graph displayed in this embodiment.

Since either one of two image memories 14-1 and 14-2 serves as a write-in image memory, data analyzed by signal analyzer 11 is written therein as needed. Graph data of the previous data excluding its deleted portion remains in the other of image memories 14-1 and 14-2 which does not serve as the write-in image memory. As a result, when data is read from both memories simultaneously, the graph displayed in polar coordinate representation does not have discontinuity on the screen of image display unit 20. This will be described with reference to FIG. 2.

Assume that the trace of a graph represented by points P10, P11, P12, ... of a certain measurement scan is displayed. Graph data for interpolating these points P10, P11, P12, ... is written in, e.g., image memory 14-1. In a next measurement scan, if the respective measurement points of data analyzed by signal analyzer 11 are represented as P20, P21, P22, ..., respectively, graph data for interpolating points P20, P21, P22, ... is written in image memory 14-2. In writing new graph data between points P20 and P21 in image memory 14-2, controller 13 writes it in image memory 14-2, and deletes graph data between points P10 and P11 of the previous measurement data written in image memory 14-1 simultaneously. In the same manner, graphic display controller 13 writes new graph data between points P21 to P22 in image memory 14-2, and deletes graph data between points P11 to P12 of a previous measurement scan written in image memory 14-1 simultaneously. Image memory 14-2, to which new graph data is written, stores new graph data between points P20 to P21, P21 to P22, ..., and image memory 14-2 stores the graph data excluding the deleted portion. Therefore, data of image memories 14-1 and 14-2 substantially maintains continuity. When graphic display controller 13 reads out data from image memories 14-1 and 14-2 in synchronism with the raster scan of image display unit 20, the polar coordinate data displayed on image display unit 20 does not have discontinuity.

Figure 9:
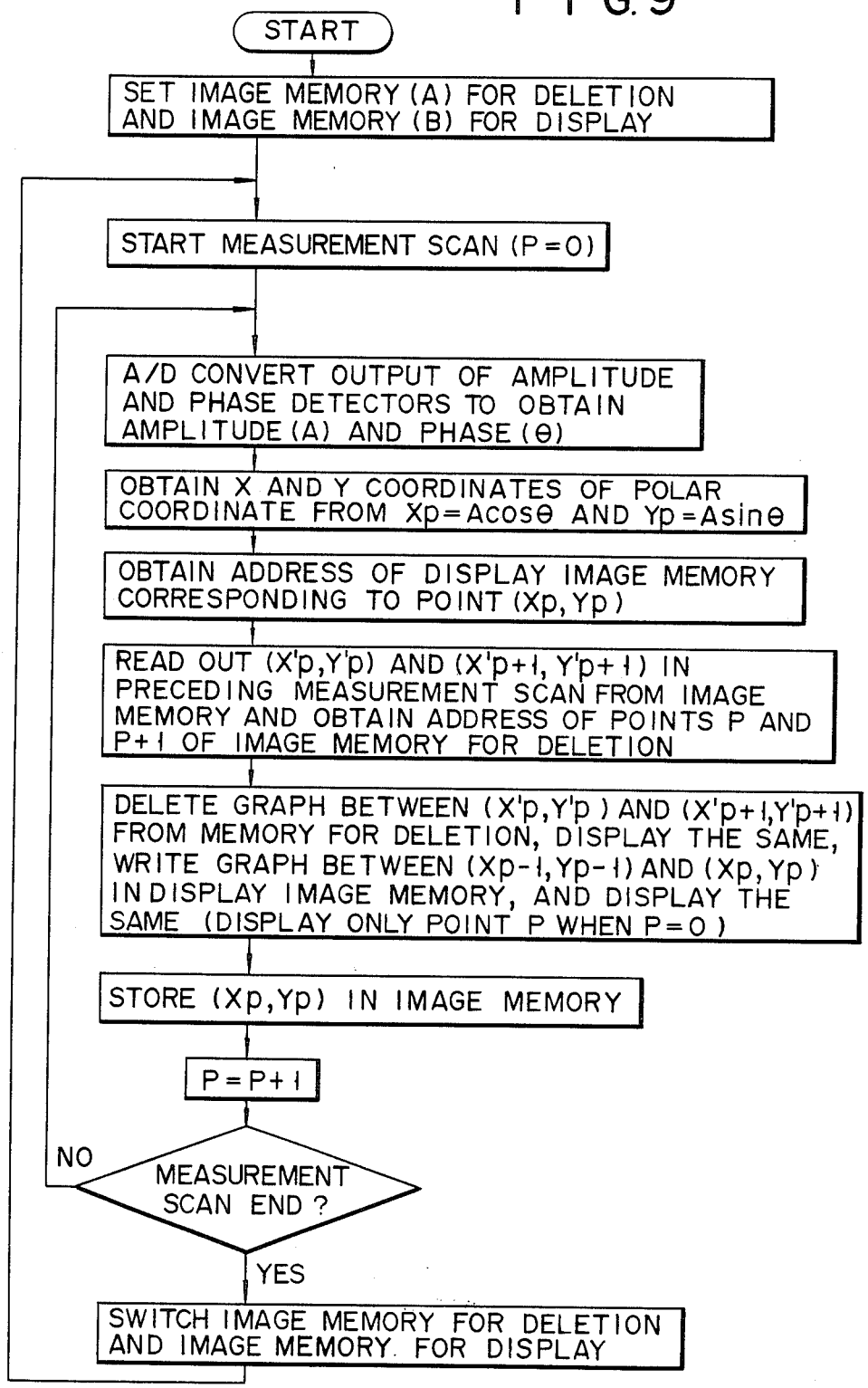
FIG. 9 is a flow chart for visually showing the operation of the device shown in FIG. 1.

FIG. 9 is a flow chart for explaining the above operation.

As described above, according to the present invention, two image memories corresponding to the screen of an image display unit are provided. These two image memories are assigned to new graph data write-in and deletion, and are switched at each measurement scan, so that graph data of a previous measurement scan can be deleted while new data is being written. Therefore, a polar coordinate graph can be displayed in a real time manner, and the displayed graph does not have discontinuity. Thus, the present invention can be applied to a measurement device which preferably displays data in a real time manner. Furthermore, the device of the present invention can easily be connected to a television set, a video plotter, or the like.

We claim:

1. A polar coordinate display device employing a raster scan scheme, said device comprising:

input means for converting vector data of a plurality of measurement points supplied in synchronism with a measurement scan into polar coordinate data, and for outputting the converted data;

display means including a screen for displaying the polar coordinate data by a raster scan scheme;

display image memory means for storing polar coordinate data output by said input means, and for reading out the stored polar coordinate data after a delay time corresponding to one measurement scan;

first and second image memory means each having a memory format corresponding to the screen of said display means;

write control means for producing graph data including means for interpolating the delayed polar coordinate data read out from said display image memory means, and for executing a write-in and deletion cycle wherein the graph data is alternately written in and deleted from said first and said second image memory means according to their memory formats, the write-in and deletion cycle being executed so that, when the graph data is written in one of said first and said second memory means at one measurement scan, graph data that has been stored during a preceding measurement scan is deleted from the other one of said memory means;

read control means for executing a readout cycle for said first and said second image memory means in a time divisional manner with the write-in and deletion cycle, including means for simultaneously accessing both said first and said second image memory means according to their memory formats in synchronism with a raster scan of said display means, and for reading out graph data corresponding to one measurement scan and graph data corresponding to the previous measurement scan from said first and said second image memory means while maintaining continuity of data; and synthesizing means for synthesizing the graph data read out from said first and said second image memory means and maintaining the continuity of data, and for supplying the synthesized graph data to said display means for display in real time.

2. A device according to claim 1, wherein said write control means comprises a memory switching circuit for switching said first and second image memories at each scan of the measurement scan so that one of said first and second image memories is switched to the write side and the other thereof is switched to a deletion side.

3. A device according to claim 1, wherein said write control means and said read control means commonly use a graphic display controller.

* * * * *